United States Patent [19]

Jenkins et al.

[11] Patent Number: 5,092,161
[45] Date of Patent: Mar. 3, 1992

[54] DUCT TESTING

[75] Inventors: Peter D. Jenkins, Woodbridge; Bruce Wiltshire, Ipswich, both of England

[73] Assignee: British Telecommunications public limited company, England

[21] Appl. No.: 326,662
[22] PCT Filed: Jul. 7, 1988
[86] PCT No.: PCT/GB88/00539
 § 371 Date: Mar. 3, 1989
 § 102(e) Date: Mar. 3, 1989
[87] PCT Pub. No.: WO89/00283
 PCT Pub. Date: Jan. 12, 1989

[30] Foreign Application Priority Data

Jul. 8, 1987 [GB] United Kingdom ............... 8716032

[51] Int. Cl.$^5$ ............................................. G01M 3/00
[52] U.S. Cl. ........................................ 73/37; 73/49.5; 73/40.5 R
[58] Field of Search ................. 73/40.5 R, 49.1, 49.5, 73/49.2, 37

[56] References Cited

U.S. PATENT DOCUMENTS

| 1,350,358 | 0/1920 | Cone .......................... 73/37 |
| 2,430,034 | 0/1947 | Stern ...................... 83/40.5 R |
| 3,690,150 | 0/1972 | Mullen ........................ 73/40 |
| 4,006,349 | 2/1977 | Royston ....................... 73/37 |
| 4,012,944 | 0/1977 | Covington et al. ......... 73/40.5 R |
| 4,272,985 | 6/1981 | Rapson, Jr. et al. ......... 73/49.2 R |
| 4,459,843 | 7/1984 | Durham ........................ 73/37 |
| 4,571,986 | 2/1986 | Fujii et al. ................. 73/49.1 |
| 4,608,857 | 9/1986 | Mertens et al. ........... 73/40.5 R |
| 4,735,231 | 4/1988 | Jacquet ................... 73/40.5 R |
| 4,796,466 | 1/1989 | Farmer ..................... 73/49.1 |

FOREIGN PATENT DOCUMENTS 420246 1/1970 Australia .
0133148 of 0000 European Pat. Off. .
2243431 of 0000 France .
2301003 of 0000 France .
211100 12/1983 Japan ..................... 73/40.5 R
6500 1/1984 Japan ..................... 73/40.5 R
13237 1/1985 Japan ..................... 73/40.5 R
61-294326 12/1986 Japan .
2122357 of 0000 United Kingdom .
WO86/06457 11/1986 World Int. Prop. O. .

OTHER PUBLICATIONS

Proceedings IECON '86, 1986, Sep. 29–Oct. 3, vol. 1, IEEE New York, U.S. H. Horigome et al.: "An Advanced Leak Detection System for Gas Pipeline", pp. 78–84.

Patent Abstracts of Japan, vol. 11, No. 162, (P-569) (2609) 26 May 1987, & JP, A, 61294326 (Tokyo Gas Co.) 25 Dec. 1986.

Patent Abstracts of Japan, vol. 9, No. 129 (P-361) (1852) 5 Jun. 1985 & JP, A, 6013237 (Hitachi Seisakusho K.K.) 23 Jan. 1985.

Primary Examiner—Hezron E. Williams
Assistant Examiner—Craig Miller
Attorney, Agent, or Firm—Nixon & Vanderhye

[57] ABSTRACT

A technique for detecting faults, blockages or holes, in a duct (6). A burst of compressed gas is injected into the duct and the decay of the pressure pulse monitored by a transducer at the gas burst launch end of the duct. A reference decay pressure that would be expected for a perfect duct is generated and the monitored decay is compared with the reference decay for deviation. A perforated duct exhibits greater pressure decay and a blocked duct less pressure decay than a perfect duct. The time occurrence of the deviation indicates the location of the fault. The signal level indicative of the pressure after a predetermined interval may also be used to measure the air friction or blowability within the duct.

18 Claims, 2 Drawing Sheets

DUCT TESTING

FIELD OF THE INVENTION

This invention relates to detection of blockages, holes, discontinuities and surface qualities in ducts or tubes.

BACKGROUND OF THE INVENTION

Lightweight transmission line packages can be installed
in a duct by a procedure known as 'fibre blowing'. The technique involves blowing compressed gas along the duct into which the transmission line is to be installed and feeding the transmission line package into the duct at the same time so that the package is urged along the duct by viscous drag of the gas flow. The technique is of particular importance to optical fibre transmission lines which can be damaged by the tension that is produced in pulled installation techniques. In new installations ducts for transmission lines are usually underground or incorporated into the structure of a building and it is difficult and/or costly to install new ducting at a subsequent date to cope with increased demand for lines or for replacement lines. Therefore when ducts are first installed additional ducts for future use will be laid, and it may be several years after the duct installation that fibre packages are actually blown through some of these ducts. A degree of over capacity may also mean that there is a choice of which duct to use. A problem that arises with this system is that, during the time between duct laying and installation of fibre, damage may occur to one or more of the ducts which renders them temporarily or permanently unsuitable for use. For example, a complete blockage caused by the duct being crushed would make it impossible for the fibre to be installed, a partial blockage may make installation very difficult and puncture may cause such a loss of the blowing gas that installation is slow or impossible and also exposes any installed fibre to potential damage from water flooding into the duct. Thus it is desirable to be able to ascertain the state of a duct prior to installation, and in the event of a fault to know its type and location. There are also occasions when the continuity or state of a duct containing an installed transmission line may require monitoring.

BRIEF SUMMARY OF THE INVENTION

Accordingly the invention provides a method of testing a duct, the method comprising introducing a pulse of compressed gas into the duct to establish a pressure wavefront advancing through the duct, determining after at least one interval during travel of the wavefront along the duct a value indicative of pressure at a particular location to give an indication of a characteristic of the duct that influences the rate of pressure change at a given location of the duct as the wavefront advances therethrough.

The invention also provides apparatus for testing a duct, the apparatus comprising means for introducing a pulse of compressed gas into the duct to establish a pressure wavefront advancing through the duct, a sensor for establishing a set of values indicative of pressure variation at a particular location as the wavefront travels along the duct, means for comparing said pressure variation with a set of values indicative of a reference pressure variation and determining whether there is a significant difference between the monitored and reference variations and means for establishing the interval between the introduction of the pulse and the onset of any significant difference between the monitored and reference pressure variations.

Another aspect of the invention provides apparatus for testing a duct, the apparatus comprising means for introducing a pulse of compressed gas into the duct to establish a pressure wavefront advancing through the duct, a sensor for monitoring pressure at a predetermined location a predetermined interval after introduction of the pulse into the duct to establish a value for the relative speed of travel of the wavefront along the duct.

BRIEF DESCRIPTION OF THE DRAWINGS

The invention is now described by way of example with reference to the accompanying drawings in which.

DETAILED DESCRIPTION OF THE EXEMPLARY EMBODIMENTS

The operation principle of the invention is the injection of a pulse of compressed gas into a duct which creates a pressure wavefront and then monitoring of the pressure decay as the wavefront travels along the duct away from a transducer. If the duct has neither a blockage nor leakage through a hole then the pressure decay monitored by the transducer follows a negative curve similar to, but not exactly, an exponential curve. If the duct has a blockage then the blockage impedes the pressure pulse wavefront and the pressure monitored by the transducer does not decay as rapidly as when there is no blockage. In the event that there is a hole in the duct then the pressure pulse is provided with an additional escape route and so the pressure decays more rapidly. In both cases the monitored decay of the pressure pulse follows the expected negative curve until the pressure pulse wavefront reaches the fault, at which point the decay deviation to a higher or lower than expected pressure is detected. From a knowledge of the velocity of the pulse wavefront, the time interval from the pulse launch to the onset of decay deviation gives an indication of the distance along the duct that the fault occurs. The velocity of wavefront travel may vary between ducts (for example as a result of different levels of air friction) and is not constant along the length of a duct and therefore it has to be generated or predicted for the tube under test. The generation of the velocity value may be made by comparison with stored values for different tubes and/or from the early decay trace obtained prior to a fault together with an approximation function of the velocity valuation.

Figure 1:
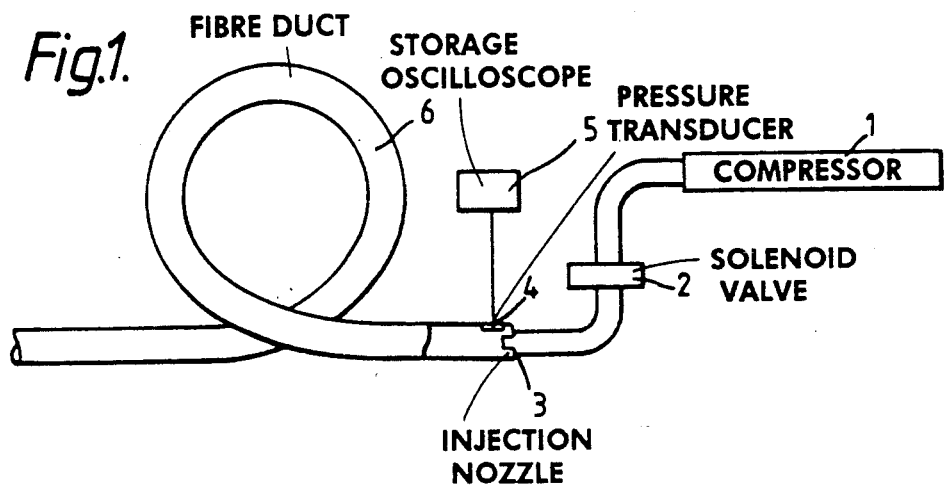
FIG. 1 illustrates a prototype embodiment of the invention.
Figure 2:
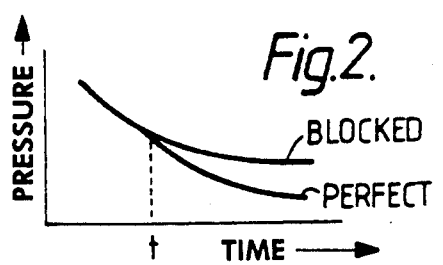
FIG. 2 shows a pressure decay trace for perfect and blocked ducts.
Figure 3:
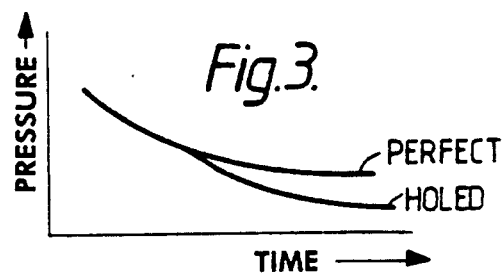
FIG. 3 shows a pressure decay trace for perfect and perforated ducts.

A prototype test system was used to evaluate the performance of the testing method, the apparatus being shown in FIG. 1 and comprising a compressor 1, solenoid valve 2, injection nozzle 3, pressure transducer 4 and storage oscilloscope 5. The nozzle 3 and transducer assembly 4 are inserted into the end of the duct 6 to be tested. Typical ducts for use in fibre blowing are made of polyethylene with an external diameter of 8 mm and an internal bore diameter of 6 mm, although ducts with external diameters in the range of 5 to 12 mm and internal diameters in the range of 3 to 10 mm are also envisaged. The ducts are fabricated in lengths of 500 meters and then joined in lengths of, typically, one or two kilometers for interbuilding connections. Typical blowing installation lengths are of the order of 500 meters (or more using tandem blowing) and so an experimental length of 500 m of duct was used with closable apertures and pinch clips at intervals by means of which holes and blockages could be made. A control circuit (not shown) opens and closes the valve in response to a push button operation to let a burst of air into the duct. The burst of air causes an increase in pressure that is sensed by the pressure transducer and input to the oscilloscope on the Y axis against a time base X axis. Initially the duct was tested with neither blockages nor holes and a negative decay curve of pressure was displayed on the oscilloscope. A blockage was then created by pinching the duct, a further burst of air introduced and the new pressure decay displayed superimposed on the trace obtained for the unblocked duct. The result of the superimposition is shown in FIG. 2, the blocked duct curve deviating from the perfect duct curve after time t. This experiment was repeated with the duct blocked at different locations and similar results obtained, the time taken for deviation to higher pressure being related to the distance of the blockage along the duct from the transducer. A similar set of tests was carried out for holes at different locations and similar results obtained except that the deviation observed was to a lower pressure. FIG. 3 shows a typical trace for a perfect duct and a duct with a hole.

It was found that the superimposed early exponential decay portions, prior to deviation, and sometimes repeated traces taken under similar conditions of duct (i.e. perfect/blocked/perforated) did not always lie exactly on top of one another. This could result from a variety of causes including drift in the transducer output, drift in the oscilloscope amplifier, from the starting (pre air burst injection) pressure in the duct being different and also from different velocities of the pulse wavefront in different tubes. However, the information required from the test is the shape of the trace at the deviation point, not a pressure value, and so all that is needed to be repeatable is the time (distance) measurement of the deviation. Further, in use on installed ducts only the duct under test is available and it can not be blocked and unblocked as was possible in the experiment. Therefore for field use the first portion of the decay monitored by the transducer may be used as a trigger to generate a reference decay expected for a perfect duct and the actual decay is compared with the generated reference. Alternatively a family of curve values may be stored and the appropriate reference curve automatically selected for comparison. This system is described in more detail later.

Figure 4:
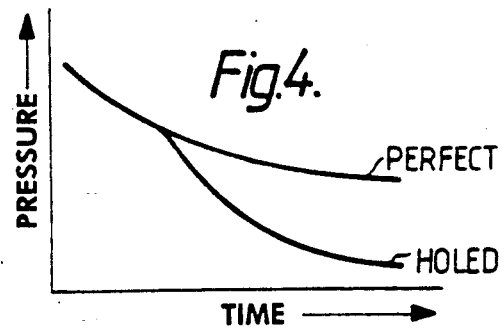
FIG. 4 shows a pressure decay trace for perfect and perforated ducts with the far end of the duct closed.

The sensitivity of the system is improved if the deviation from the reference decay is increased, and this can be achieved by blocking off the far end of the duct. FIG. 4 shows the effect on the decay of blocking off the far end of a perforated duct, and from comparison with FIG. 3 it can be seen that the deviation is more noticeable. Of course in the event of a totally blocked duct there is no benefit in blocking off the far end. The send (transducer) end of the duct is generally blocked so that decay in a single direction is monitored. For correlation purposes or to identify blockages close to the send end, the duct may be tested from each end.

Figure 5:
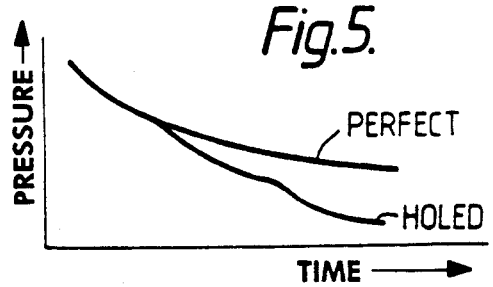
FIGS. 5 & 6 show pressure decay traces for perfect and doubly faulted ducts.
Figure 6:
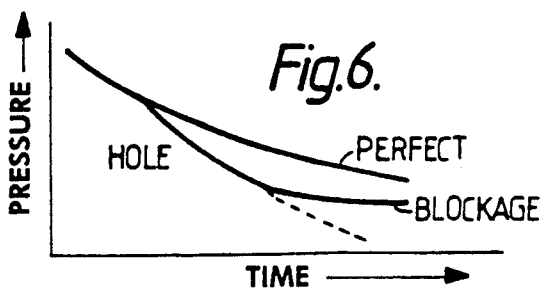

If a duct has more than one fault these may also be detected, but only faults up to and including the first total blockage. Thus two holes can be detected, the trace undergoing two deviations as shown in FIG. 5, and a hole followed by a blockage is also detectable as shown in FIG. 6.

The system may be arranged to provide a visual output of the trace, either on a chart recorder or a screen from which the installation engineer can analyse the result, or the decay and reference values may be electronically compared and deviation in excess of a given value logged out as a fault with the sign of the difference value indicating the type of fault. Some faults such as partial blockages and multiple faults may be easier to interpret from a trace than by electronic means.

Monitoring of pressure pulse decay also enables comparison of ducts or assessment of air friction values and may be utilised in other aspects of quality control, and in particular for indicating 'blowability' or potential blown installation speed of ducts.

Figure 7:
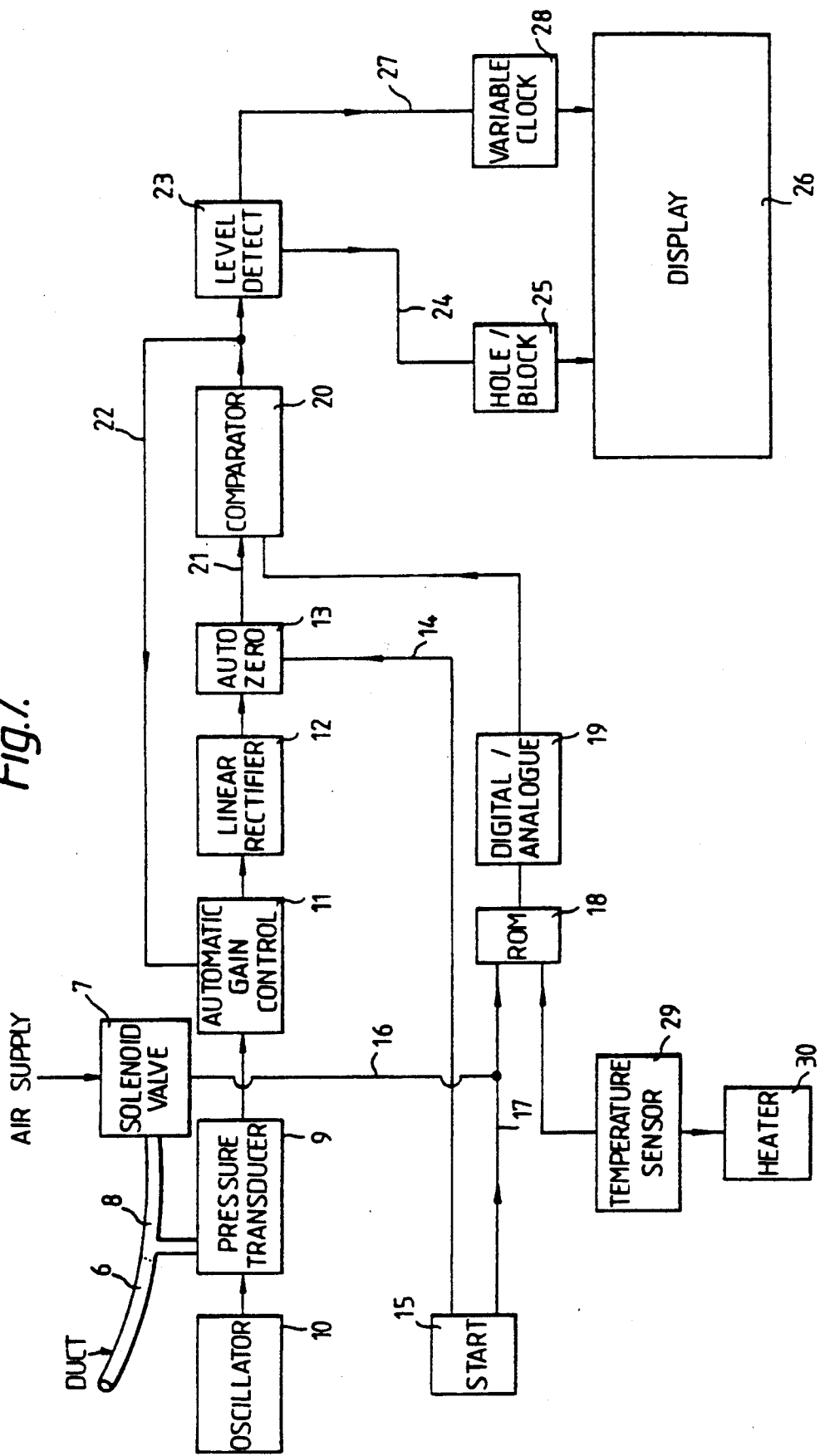
FIG. 7 is a block diagram of a preferred embodiment of the invention.

FIG. 7 shows a block diagram of a practical embodiment of the invention for field use. In moving from a laboratory prototype to a practical embodiment that may be used in different temperature environments, it becomes necessary to compensate for temperature variation otherwise the temperature dependent drift in the circuit (especially in the pressure transducer) can distort readings Also, the ducts under test may vary not only in internal surface finish but the air different wavefront velocity: the faster the wavefront velocity the more rapid the pressure decay, and therefore a curve from a 'faster' duct compared with a 'slower' duct may show a deviation that is of the same order of magnitude as that for a holed duct. In order to overcome this the apparatus is provided with a memory in which decay traces from a family of ducts of varying types and at various temperatures may be stored for retrieval as references depending upon the conditions encountered. The circuit itself is also temperature dependent and in order to prevent drift in the pressure transducer the temperature within the circuit box is monitored and controlled, and in the event that the temperature moves out of the controllable range an indication is given to address a different stored set of values for comparison, relevant to the circuit operation at the new temperature conditions. It would be possible to have a complete range of values for all possible temperatures or to have a wider range of temperature control, but it is preferable in terms of size and memory capacity to have the system described.

Referring specifically to FIG. 7, the duct 6 under test is connected to a branched connection duct 8 connected to the output of a solenoid valve 7 which controls the duration of an air (or other fluid) burst into the duct. The air may be supplied from a compressed air line, generally via a pressure regulator, or from another source and is stored in a discharge chamber connected to the solenoid. It has been found satisfactory to utilise a one liter discharge chamber at a pressure of about 2 bar. The solenoid valve operates to connect the discharge chamber to the duct for a selected period of time, intervals of the order of 500 to 800 milliseconds having been found satisfactory. The discharge chamber is then recharged for the next test. It would be possible to substitute a mechanically loaded discharge chamber (eg. a chamber with a piston and compression spring held on a trigger) to generate the air burst. With the compressed air loaded discharge chamber it has been found desirable to load the chamber via a restricted orifice of 0.5 mm in order to limit the effect of the air pressure regulator recharging the chamber during the discharge period.

The branch from connection duct 8 is connected to a pressure transducer 9, which is preferably an a.c. bridge with its a.c. supply generated from an oscillator 10. The output of the oscillator is input to an automatic gain control 11 which adjusts the signal to a predetermined level and thereby compensates for variations such as fluctuation in discharge chamber pressure or pulse duration. The signal then passes through a linear rectifier 12, through an automatic zeroing circuit 13 which is inhibited during measurements, the inhibit auto zero signal being transmitted along line 14 from the start switch 15, which is also connected on line 16 to trigger opening of the solenoid valve 7 and along line 17 to the ROM 18 to activate read out of a stored perfect duct signal which is converted back into an analogue signal in the digital to analogue converter 10 and input to a comparator 20 where it is compared with the measurement signal which is input to the comparator on line 21. From the output of the comparator there is a feedback loop 22 to the automatic gain control, the main output being input to a level detector 23 which determines whether the difference value signal from the comparator exceeds a predetermined value or 'significant value', that is a value which is greater than the error or normal variation caused by environmental changes for example. If it does exceed the significant value, the signal is transmitted on line 24 to hole/blockage indicator 25 which initiates a hole or block signal for the display 26 depending upon whether the difference value was positive (measured signal higher than reference signal) indicative of a blockage or negative (measured signal lower than reference signal) indicative of a hole. At the same time a signal from the level detector on line 27 stops the clock 28 which then provides a readout of time elapsed to the display; the elapsed time may be displayed in terms of distance rather than time. The significant value may be adjustable, particularly in response to temperature change in order to vary the sensitivity.

As mentioned previously, the circuit includes a temperature sensor, referenced 29, which senses the temperature in the proximity of the circuit and activates a heater 30 to maintain the temperature at a predetermined operating temperature. It has been found convenient to set the predetermined temperature at 35° C., which is a little higher than the natural temperature of the circuit environment. The temperature sensor is also connected to the ROM 18 to change the addressed set of reference values in the event of uncompensated temperature variation.

It has presently been found convenient to analyse ducts sections of 0 to 50 meters, 50 to 300 meters and 300 to 1,000 meters, although these ranges may be altered, and it is possible to extend the ranges beyond 1,000 meters. For this purpose, prior to starting the test the operating range is selected so that the correct range of reference curve is read out from the ROM and the comparison is delayed until the wavefront will have reached the relevant section of duct. It is also possible to enter other selection data such as pulse duration (which is preferably increased by increasing the opening time of the solenoid valve to increase the signal level for longer ranges) and type of reference duct best matched to the duct being tested: e.g. diameter, material type or even a previous quality control or blowability measurement if known.

If the type of duct being tested has not been previously tested, or is an unknown type, it may be necessary to run several comparison tests with different reference duct values. This may be done manually by systematically changing the selectable input data, or by storing the measured data (for example in a RAM interposed between the auto zero 13 and comparator 20) and then automatically repeatedly reading out the measured data into the comparator with different references. If the reference values that are used in the comparison do not accurately reflect the decay curve for a perfect duct of the type being tested then the deviations that this poor matching causes give rise to 'false alarm' faults and incorrect location of actual faults. However it is found that a poorly matched reference always indicates faults at a shorter distance from the launch end of the duct than the correct location. Thus when comparing a measured decay pulse with a series of reference pulses, (whether manually or automatically) it is the reference that indicates the furthest distance to a fault (or in extreme instances, no fault) that is the correct reference.

It is preferable to have a display for the actual trace as well as a fault location indicator, as there are some duct characteristics or decay patterns that may be recognisable to engineers but are too sophisticated to be easily adapted to automatic diagnosis.

A modification of the system is to utilise it for determining the relative propagation velocities of an air burst within different ducts. In this technique a pulse is launched into a duct and a signal level reading taken after a preselected period of time. On the assumption of perfect ducts (which may for example have previously been tested for holes and blockages, and/or may have been recently fabricated and be wound on a drum) the faster the pulse travels through the tube then the more rapid is the decay, thus ducts with higher signal levels after the predetermined interval are those in which the pulse is travelling more slowly and which may therefore be slower to blow fibres along. If the signal level representing pressure (e.g. voltages) is recorded for standard air bursts (or for a normalised signal) and particular duct dimensions, then it is possible to quantify the 'blowability' of ducts for example after production and/or after installation.

We claim:

1. A method of testing a duct having first and second ends, the method comprising the steps of:
   introducing at or adjacent said first end a pulse of compressed gas into the duct to establish a pressure wavefront advancing through the duct,
   determining after at least one time interval following said introduction and during travel of the wavefront along the duct a value indicative of pressure decay at a particular location to given an indication of a characteristic of the duct that influences the rate of pressure decay at a given location of the duct intermediate said first and second ends as the wavefront advances therethrough, whereby the location of a fault intermediate said first and second ends can be detected.

2. A method according to claim 1 including the steps of:

monitoring the pressure decay at the particular location as the wavefront advances through the duct, comparing said monitored pressure decay with a set of values indicative of a reference pressure decay to detect a significant difference between the monitored and reference pressure decays, and determining the time interval between introduction of the pulse and any significant detected difference to give an indication of the location of a fault in the duct.

3. A method according to claim 1 in which the pressure at the particular location is established after a predetermined interval to give an indication of the average speed of travel of the wavefront along the duct.

4. Apparatus for testing a duct, the apparatus comprising:

means for introducing a pulse of compressed gas into the duct to establish a pressure wavefront advancing through the duct, a sensor for establishing a set of values indicative of pressure variation at a particular location as the wavefront travels along the duct, means for comparing said pressure variation with a set of values indicative of a reference pressure variation and determining whether there is a significant difference between the monitored and reference variations, and means for establishing the time interval between the introduction of the pulse and the onset of any significant difference between the monitored and reference pressure variations.

5. Apparatus according to claim 4 further comprising means for varying the set of values indicative of the reference pressure variation.

6. Apparatus according to claim 4 further comprising means for storing the set of values indicative of pressure variation and comparing such values with a plurality of different sets of values indicative of reference pressure variation.

7. Apparatus according to claim 4 in which the temperature of the sensor is controlled.

8. Apparatus according to claim 4 in which the pressure variation that is monitored is pressure decay as the pulse wavefront travels away from the sensor which is located proximate the end of the duct into which the pulse is introduced.

9. Apparatus according to claim 4 in which the means for comparing comprises a monitor for displaying a trace of the sensed pressure variation.

10. Apparatus for testing a duct, the apparatus comprising:

means for introducing a pulse of compressed gas into the duct to establish a pressure wavefront advancing through the duct, a sensor for monitoring pressure at a predetermined location a predetermined time interval after introduction of the pulse into the duct to establish a value for the relative speed of travel of the wavefront along the duct.

11. A method for detecting leak and blockages in an elongated duct, said method comprising the steps of:

injecting a pulse of compressed gas into an accessible end of said duct;

monitoring the resulting gas pressure decay as a function of time at a predetermined location in the duct proximate said accessible end; and comparing said gas pressure decay to a nominally perfect reference pressure decay curve (a) to detect a duct blockage if the monitored decaying pressure substantially exceeds said reference pressure decay curve, and (b) to detect a duct leakage if the monitored decaying pressure is substantially lower than said reference pressure decay curve.

12. A method as in claim 11 further comprising the step of:

determining the approximate location of a detected leak or blockage with respect to said accessible end of the duct as a function of the elapsed time interval from pulse injection until a substantial deviation from said reference pressure decay curve is first detected during said comparing step.

13. A method for detecting a leak or blockage fault in an elongated duct, said method comprising the steps of:

propagating a wavefront of compressed pressure gas along said duct from a first end toward a second end;

measuring the resulting gas pressure at a predetermined fixed location in said duct during said propagating step; and comparing the measured gas pressure as a function of time with at least one reference gas pressure as a function of time, said reference gas pressure representing the expected variation of gas pressure at said location as a function of time in response to said propagating wavefront for a nominally defect-free duct and detecting a substantial deviation from the expected variation as a leak or blockage fault in the duct.

14. A method as in claim 13 further comprising:

measuring an elapsed time from a reference time until detecting said substantial deviation as a measure of the relative location of such detected fault.

15. Apparatus for detecting leaks and blockages in an elongated duct said apparatus comprising:

means for injecting a pulse of compressed gas into an accessible end of said duct;

means for monitoring the resulting gas pressure decay as a function of time at a predetermined location in the duct proximate said accessible end; and means for comparing said gas pressure decay to a nominally reference pressure decay curve to detect a duct blockage if the monitored decaying pressure substantially exceeds said reference pressure decay curve and to detect a duct leakage if the monitored decaying pressure is substantially lower than said reference pressure decay curve.

16. Apparatus as in claim 15 further comprising:

means for determining the approximate location of a detected leak or blockage with respect to said accessible end of the duct as a function of the elapsed time interval from pulse injection until a substantial deviation from said reference pressure decay curve is first detected during said comparing step.

17. Apparatus for detecting a leak or blockage fault in an elongated duct, said apparatus comprising:

means for propagating a wavefront of compressed pressure gas along said duct from a first end toward a second end;

means for measuring the resulting gas pressure at a predetermined fixed location in said duct during said propagating step; and means for comparing the measured gas pressure as a function of time with at least one reference gas pressure as a function of time, said reference represented the expected variation of gas pressure at said location as a function of time in response to said propagating wavefront for a nominally defect-free duct and detecting a substantial deviation from the expected variation as a leak or blockage fault in the duct.

18. Apparatus as in claim 17 further comprising: means for measuring an elapsed time from a reference time until detecting said substantial deviation as a measure of the relative location of such detected fault.

* * * * *